United States Patent
Lee et al.

(10) Patent No.: US 7,750,416 B2
(45) Date of Patent: Jul. 6, 2010

(54) MODIFYING WORK FUNCTION IN PMOS DEVICES BY COUNTER-DOPING

(75) Inventors: Chun-Yi Lee, Bei-Pu Village (TW);
Harry Chuang, Austin, TX (US);
Ping-Wei Wang, Hsin-Chu (TW);
Kong-Beng Thei, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 170 days.

(21) Appl. No.: 11/416,938

(22) Filed: May 3, 2006

(65) Prior Publication Data
US 2007/0257308 A1    Nov. 8, 2007

(51) Int. Cl.
*H01L 29/76* (2006.01)
(52) U.S. Cl. ............. 257/391; 257/407; 257/E27.098; 257/E21.661
(58) Field of Classification Search .......... 257/334, 257/407, 372, 391, E27.098, E21.661; 438/275
See application file for complete search history.

(56) References Cited

U.S. PATENT DOCUMENTS

| | | | | |
|---|---|---|---|---|
| 5,378,650 A | * | 1/1995 | Kimura | 438/298 |
| 5,880,503 A | * | 3/1999 | Matsumoto et al. | 257/372 |
| 5,965,926 A | * | 10/1999 | Schwalke | 257/407 |
| 6,380,015 B1 | * | 4/2002 | Schwalke | 438/199 |
| 2002/0027256 A1 | * | 3/2002 | Ishibashi et al. | 257/391 |
| 2005/0079696 A1 | * | 4/2005 | Colombo | 438/595 |
| 2006/0138398 A1 | * | 6/2006 | Shimamune et al. | 257/19 |

OTHER PUBLICATIONS

Hori et al., ("A new P-Channel MOSFET with Large Tilt Angle Implanted Punch-Through Stopper (LATIPS)", IEEE Electron Dev. Letts., EDL-9, Dec. 1988, p. 641).*

* cited by examiner

*Primary Examiner*—Kiesha R Bryant
*Assistant Examiner*—Tucker Wright
(74) *Attorney, Agent, or Firm*—Slater & Matsil, L.L.P.

(57) ABSTRACT

A semiconductor structure comprising an SRAM/inverter cell and a method for forming the same are provided, wherein the SRAM/inverter cell has an improved write margin. The SRAM/inverter cell includes a pull-up PMOS device comprising a gate dielectric over the semiconductor substrate, a gate electrode on the gate dielectric wherein the gate electrode comprises a p-type impurity and an n-type impurity, and a stressor formed in a source/drain region. The device drive current of the pull-up PMOS device is reduced due to the counter-doping of the gate electrode.

4 Claims, 8 Drawing Sheets

MODIFYING WORK FUNCTION IN PMOS DEVICES BY COUNTER-DOPING

TECHNICAL FIELD

This invention relates generally to semiconductor devices, and more particularly to memory cells, and even more particularly to the fabrication of integrated circuits comprising static random access memory cells.

BACKGROUND

Scaling of semiconductor devices (e.g., a metal-oxide semiconductor field-effect transistor) has enabled continued improvement in speed, performance, density, and cost per unit function of integrated circuits over the past few decades. Continuing the scaling of MOSFETs results in severe degradation of carrier mobility, however, which in turn adversely affects the device drive current. To further enhance the performance of MOS devices, carrier mobility enhancement becomes a key element in developing next generation technologies. Among efforts to improve carrier mobility, introducing stress into the channel region of MOS devices is widely adopted. Generally, it is desirable to induce a tensile stress in the channel region of an n-type metal-oxide-semiconductor ("NMOS") device in a source-to-drain direction, and to induce a compressive stress in the channel region of a p-type metal-oxide-semiconductor ("PMOS") device in a source-to-drain direction.

A commonly used method for applying compressive stress to the channel regions of PMOS devices is growing SiGe stressors in the source and drain regions of the respective PMOS devices. Such a method typically includes the steps of forming recesses in a silicon substrate along edges of gate spacers, epitaxially growing SiGe stressors in the recesses, and annealing. Since SiGe has a greater lattice constant than the silicon substrate does, after annealing, it expands and applies a compressive stress to the channel region, which is located between a source SiGe stressor and a drain SiGe stressor.

The above-discussed method, however, suffers drawbacks when used for the formation of static random access memory (SRAM) cells. FIG. 1 illustrates an exemplary circuit diagram of a six-transistor SRAM cell, which includes pass-gate transistors PG1 and PG2, pull-up transistors PU1 and PU2 and pull-down transistors PD1 and PD2. Gates 2 and 4 of the respective pass-gate transistors PG1 and PG2 are controlled by a word-line WL that determines whether the current SRAM cell is selected or not. A latch formed of pull-up transistors PU1 and PU2 and pull-down transistors PD1 and PD2 stores a state. The stored state can be read or written through a bit line BL.

Conventionally, on a memory chip, PMOS devices in both peripheral circuits and memory circuits are formed with SiGe stressors, which causes significant improvement in the drive currents of the pull-up PMOS devices in SRAM cells. The drive currents of pull-down NMOS devices, however, are difficult to improve, and thus have relatively smaller drive currents. The unbalanced performance of PMOS and NMOS devices causes a writing problem. For example, when a "0" is written into the memory cell, the pull-up transistor PU2 has a high drive current, hence a high ability for supplying charges from Vcc to node 6. Conversely, NMOS device PD2 has a relatively low drive current, hence a low ability for discharging charges from node 6 to Vss. Consequently, it takes a long period of time to write the state "0" Additionally, write margins of the SRAM cells are degraded due to the high drive currents of PMOS devices. A low write margin results in an increased possibility of erroneous writing. For high performance SRAM cells, read and write operations are preferably balanced. Therefore, it is preferred that the drive currents of pull-up PMOS devices in SRAM cells be controlled.

The above-discussed problems have also been found in the design of inverters. A typical inverter includes a PMOS device serially connected to an NMOS device. In order to quickly change the output voltage between a high voltage and a low voltage, it is also preferred that the drive current of the PMOS device be controlled.

The approaches for reducing the drive currents of PMOS devices include increasing the gate lengths of PMOS devices and increasing pocket/channel implantation dosages. However, when technologies evolve into 65 nm or lower, there is very little room for increasing the gate lengths, and the resulting reductions in drive currents of PMOS devices are not adequate to compensate for the increase in drive currents due to the formation of SiGe stressors. Increasing pocket/channel implantation dosages can also reduce device drive currents. However, the leakage currents are increased with the increase in the doping concentration adjacent the channel regions. Therefore, the ability to increase the gate lengths of PMOS devices and to increase the pocket/channel implantation dosages is limited.

A possible solution for such a problem is to form SiGe stressors for PMOS devices in the peripheral circuit, but not for the pull-up PMOS devices in SRAM cells. Such a solution is not preferred, however, since the peripheral circuit typically occupies a small region on a memory chip, and thus SiGe stressors will only be formed in a small region, resulting in pattern loading effects and process difficulties for subsequent process steps.

SUMMARY OF THE INVENTION

In accordance with one aspect of the present invention, a semiconductor structure includes a semiconductor substrate and a PMOS device. The PMOS device includes a gate dielectric over the semiconductor substrate, a gate electrode on the gate dielectric, wherein the gate electrode comprises a p-type impurity and an n-type impurity, and a pocket region in the semiconductor substrate and adjacent the gate dielectric. The pocket region comprises an n-type impurity, and the n-type impurity in the gate electrode has a concentration substantially greater than a concentration of the n-type impurity in the pocket region.

In accordance with another aspect of the present invention, a semiconductor structure includes a semiconductor substrate and a PMOS device. The PMOS device includes a gate dielectric over the semiconductor substrate, and a gate electrode on the gate dielectric, wherein the gate electrode comprises a p-type impurity and an n-type impurity. Preferably, the n-type impurity has a concentration of greater than about $1 \times 10^{19}$/cm$^3$.

In accordance with another aspect of the present invention, a semiconductor structure includes a substrate comprising a peripheral circuit and a SRAM circuit. The peripheral circuit includes a peripheral PMOS device, which includes a first gate dielectric over the semiconductor substrate and a first gate electrode on the first gate dielectric. The SRAM circuit includes an SRAM PMOS device comprising a second gate dielectric over the semiconductor substrate, and a second gate electrode on the second gate dielectric. A concentration of n-type impurities in the first gate electrode is less than a concentration of n-type impurities in the second gate electrode.

In accordance with yet another aspect of the present invention, a method for forming a PMOS device includes forming a gate dielectric over the semiconductor substrate, forming a gate electrode on the gate dielectric, wherein the gate electrode comprises a p-type impurity and an n-type impurity, forming a pocket region in the substrate and adjacent the gate dielectric wherein the n-type impurity in the gate electrode has a concentration substantially greater than an n-type impurity concentration of the pocket region, and forming a source/drain region in the substrate and adjacent a region under the gate dielectric.

In accordance with yet another aspect of the present invention, a method for forming a PMOS device includes providing a substrate comprising a peripheral circuit region and a balanced-performance circuit region, wherein the peripheral circuit region comprises a first region for forming a PMOS device and a second region for forming an NMOS device, and wherein the balanced-performance circuit region comprises a third region for forming a PMOS device and a fourth region for forming an NMOS device. The method further includes forming a gate dielectric layer on the substrate, forming a gate electrode layer on the gate dielectric layer, masking the first region, pre-doping the gate electrode layer in the second, the third and the fourth regions with an n-type impurity, and patterning the gate dielectric layer and the gate electrode layer to form a first, a second, a third and a fourth gate stack in the first region, the second region, the third region and the fourth region, respectively.

With the counter-doping in the gate electrode of the PMOS devices, SRAM cells and inverters have increased write margins. The write speed and reliability are also improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention, which combines the formation of PMOS and NMOS devices for peripheral circuits and SRAM cells, are illustrated. Throughout the various views and illustrative embodiments of the present invention, like reference numbers are used to designate like elements. It should be appreciated that although a SRAM region is referred to (and illustrated) throughout the description for simplicity, the present invention is readily applied to the design of inverters or any other circuits preferring balanced PMOS and NMOS device performance, simply by replacing the SRAM cell with other circuits.

Figure 1:
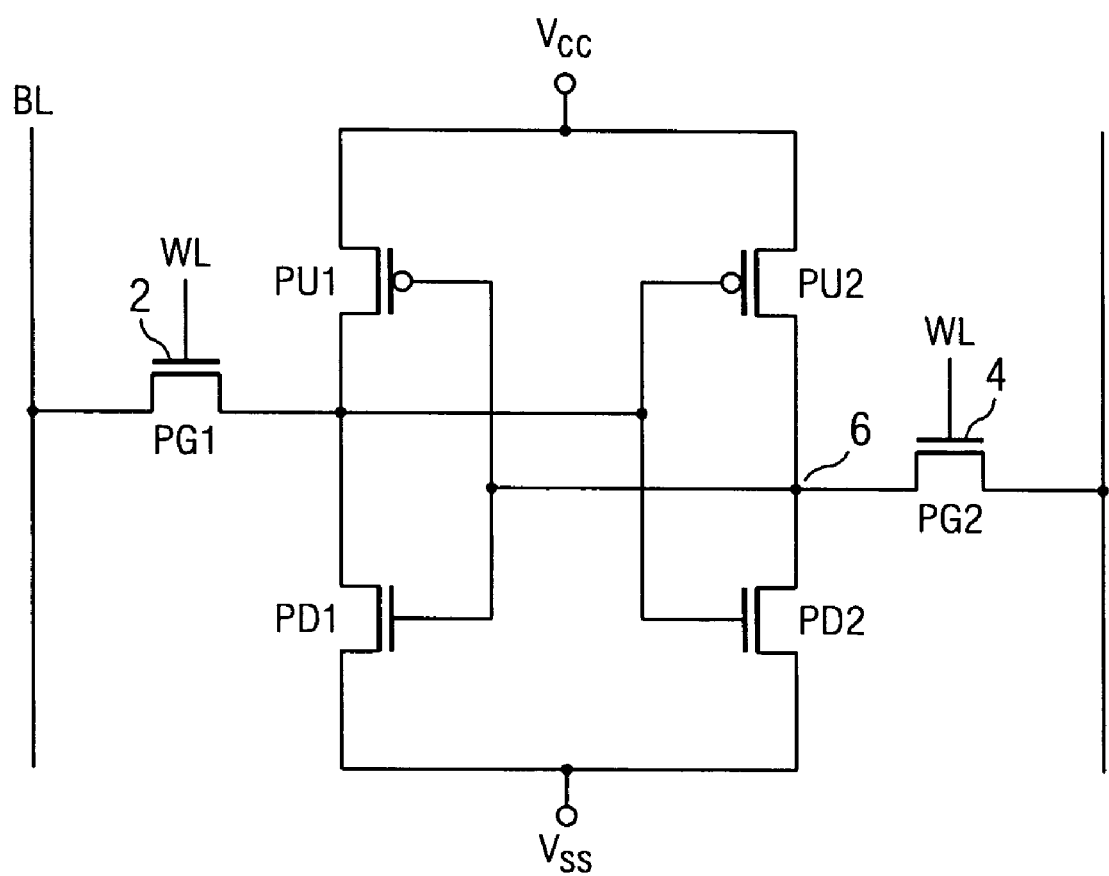
FIG. 1 illustrates a circuit diagram of a conventional six-transistor SRAM cell.
Figure 2:
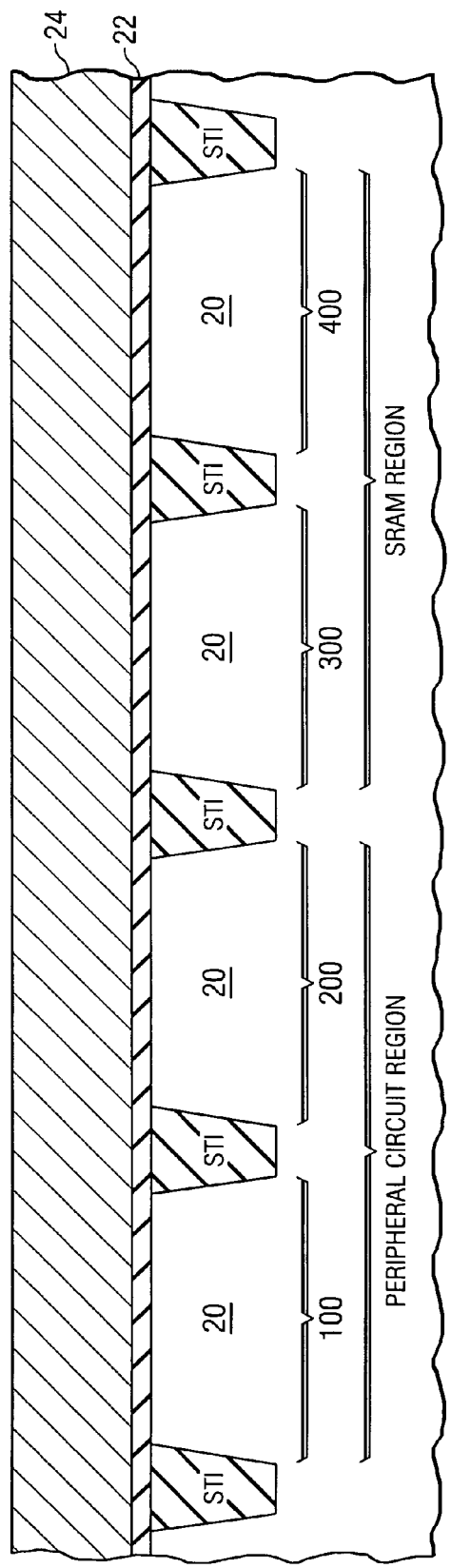
FIGS. 2 through 7 are cross-sectional views of intermediate stages in the manufacture of a preferred embodiment, wherein PMOS and NMOS devices in an SRAM cell and a peripheral circuit are formed.

FIG. 2 illustrates a substrate 20, which includes a peripheral circuit region and an SRAM region isolated by shallow trench isolation (STI) regions. Substrate 20 preferably comprises bulk silicon, although other commonly used structures and materials such as silicon on insulator (SOI) and silicon alloys can be used. The peripheral circuit region further includes an active region 100 for forming a PMOS device and an active region 200 for forming an NMOS device. The SRAM region further includes an active region 300 for forming a pull-up PMOS device and an active region 400 for forming a pull-down NMOS device. The substrate 20 is preferably lightly doped. As previously discussed, the marked SRAM region can also be an inverter region or other circuit region. In the preferred embodiment, the term "peripheral circuit region" includes regions that are not SRAM regions.

A gate dielectric layer 22 is formed on the substrate 20. In the preferred embodiment, the gate dielectric layer 22 has a high dielectric constant (k value), preferably greater than about 3.9. It preferably comprises silicon oxides, silicon nitrides, oxynitrides or dielectric metal oxides, such as $HfO_2$, $HfZrO_x$, $HfSiO_x$, $HfTiO_x$, $HfAlO_x$, and the like. The preferred methods for forming the gate dielectric layer 22 include chemical vapor deposition (CVD) techniques such as low temperature CVD (LTCVD), low pressure CVD (LPCVD), rapid thermal CVD (RTCVD), plasma enhanced CVD (PECVD), etc., and other commonly used methods.

A gate electrode layer 24 is formed on the gate dielectric layer 22. The gate electrode layer 24 preferably comprises polysilicon, and is preferably formed using commonly used methods such as polycide, salicide, and the like. Gate electrode layer 24 can also comprise metal silicides.

Figure 3:
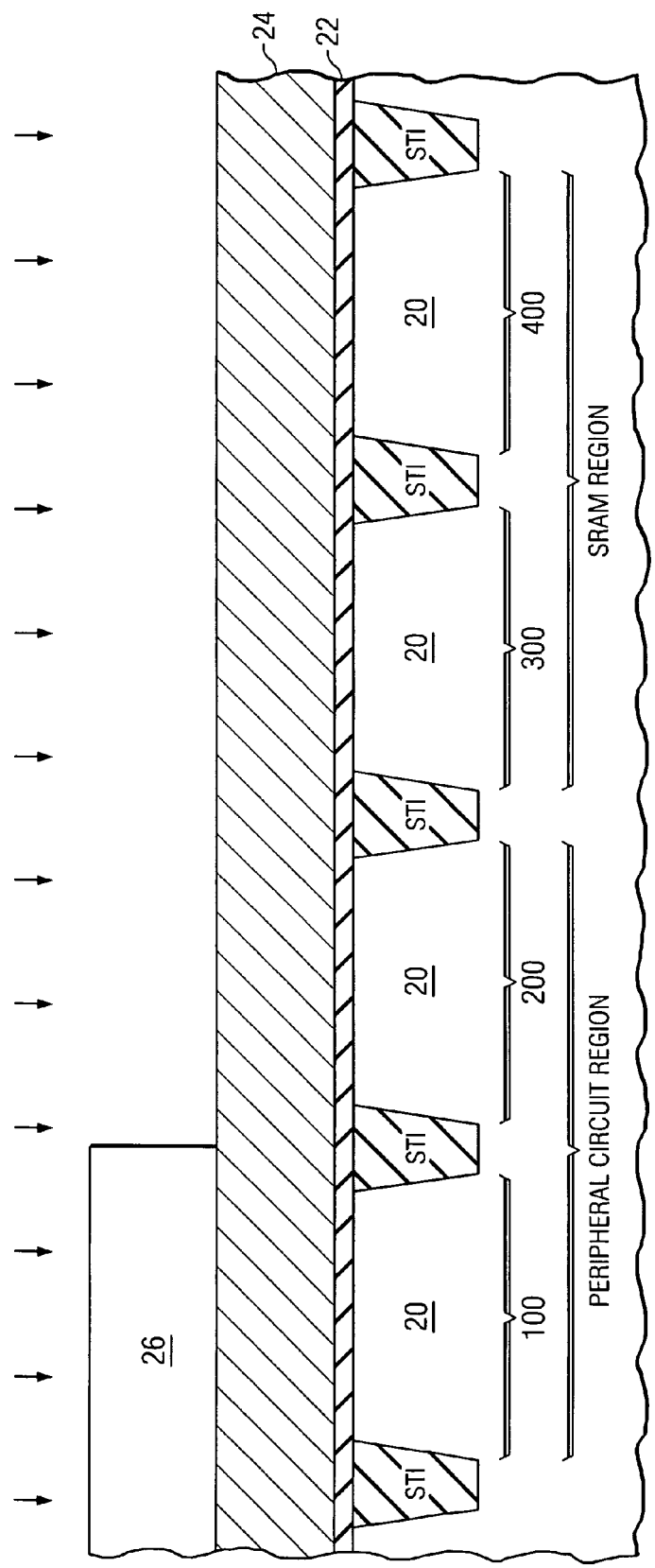

An n-type pre-doping is performed, as shown in FIG. 3. As is known in the art, the pre-doping of n-type impurities for gate electrodes of NMOS devices reduces the work function and the likelihood of poly-gate depletion. A photo resist 26 is formed and patterned, covering PMOS region 100 while leaving NMOS region 200 and SRAM regions 300 and 400 exposed. An n-type impurity, such as phosphorous, arsenic, antimony, and the like, is implanted into the gate electrode layer 24. The photo resist 26 is then removed.

In the preferred embodiment, the gate electrode layer 24 in PMOS region 300 is pre-doped simultaneously with the NMOS regions 200 and 400. The impurity concentration in the gate electrode layer 24 is preferably greater than about $1\times10^{19}/cm^3$ and more preferably between about $1\times10^{19}/cm^3$ and about $1\times10^{21}/cm^3$, although higher concentrations such as greater than about $1\times10^{21}/cm^3$ or lower concentrations such as less than about $1\times10^{19}/cm^3$ may also be used. In other embodiments, the photo resist 26 covers PMOS regions 100 and 300, and only NMOS regions 200 and 400 are doped with n-type impurities. An additional photo resist is thus formed covering regions 100, 200 and 400 for an additional pre-doping process. In the additional pre-doping process, an n-type dopant is implanted into region 300. With the formation of a separate photo resist, higher or lower concentrations can be doped in the gate electrode layer 24 in region 300, however, albeit at the cost of additional lithography and implantation processes. In conventional processes, the gate electrodes of PMOS devices are doped with p-type impurities, while in the above-discussed process steps, an n-type impurity is used, hence the pre-doping of the gate electrode layer 24 in PMOS region 300 is referred to as counter-doping.

The effect of doping the gate electrode layer 24 in PMOS region 300 with n-type impurities will be discussed in subsequent paragraphs.

Figure 4:
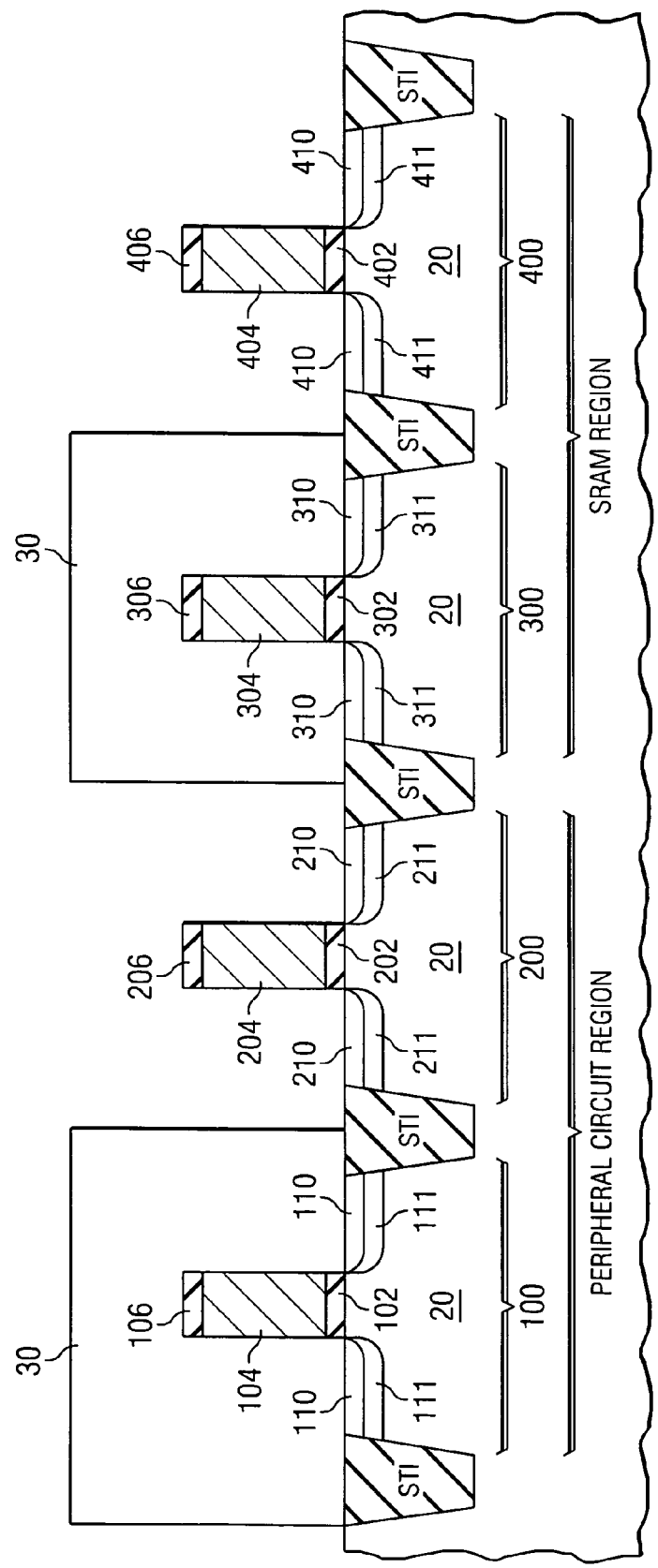

FIG. 4 illustrates the formation of gate stacks and lightly-doped drain/source (LDD) regions and pocket regions for PMOS and NMOS devices. Preferably, a hard mask layer (not shown) is formed on the gate electrode layer 24, wherein the hard mask layer preferably comprises silicon nitride. The gate dielectric layer 22, gate electrode layer 24 and the hard mask layer are then patterned, forming gate stacks in regions 100, 200, 300 and 400. The patterned hard mask layer, gate electrode layer 24 and gate dielectric layer 22 form hard masks 106, 206, 306 and 406, gate electrodes 104, 204, 304 and 404 and gate dielectrics 102, 202, 302 and 402, in regions 100, 200, 300 and 400, respectively.

To form LDD regions 210 and 410 and pocket regions 211 and 411, a photo resist 30 is formed over and masks PMOS regions 100 and 300, and an implantation is performed to introduce n-type impurities into the NMOS regions 200 and 400. LDD regions 210 and 410 are formed substantially aligned with the edges of the gate electrodes 204 and 404, respectively. Pocket regions 211 and 411 are also preferably formed by implanting p-type impurities. In the preferred embodiment, pocket regions 211 and 411 have a concentration of less than about $1 \times 10^{19}/cm^3$, and more preferably about $1 \times 10^{18}/cm^3$ or less. Photo resist 30 is then removed. Similarly, by forming a photo resist (not shown) covering the regions 200 and 400 and implanting regions 100 and 300, p-type LDD regions 110 and 310 can be formed. In addition, pocket regions 111 and 311, which comprise n-type impurities, are also formed using the same photo resist as a mask. The photo resist is then removed. It is to be realized that although pocket regions 311 and gate electrode 304 both include n-type impurities, the concentration of n-type impurities in gate electrode 304 tends to be higher than the concentration of n-type impurities in pocket regions 311, which are introduced, for example, by pre-doping.

In alternative embodiments wherein there is no hard mask 306 formed, the gate electrode 304 may be doped at the same time as the n-type LDD regions 210 and 410 are implanted. This can be achieved by forming an opening in the photo resist 30 to expose the gate electrode 304.

Figure 5:
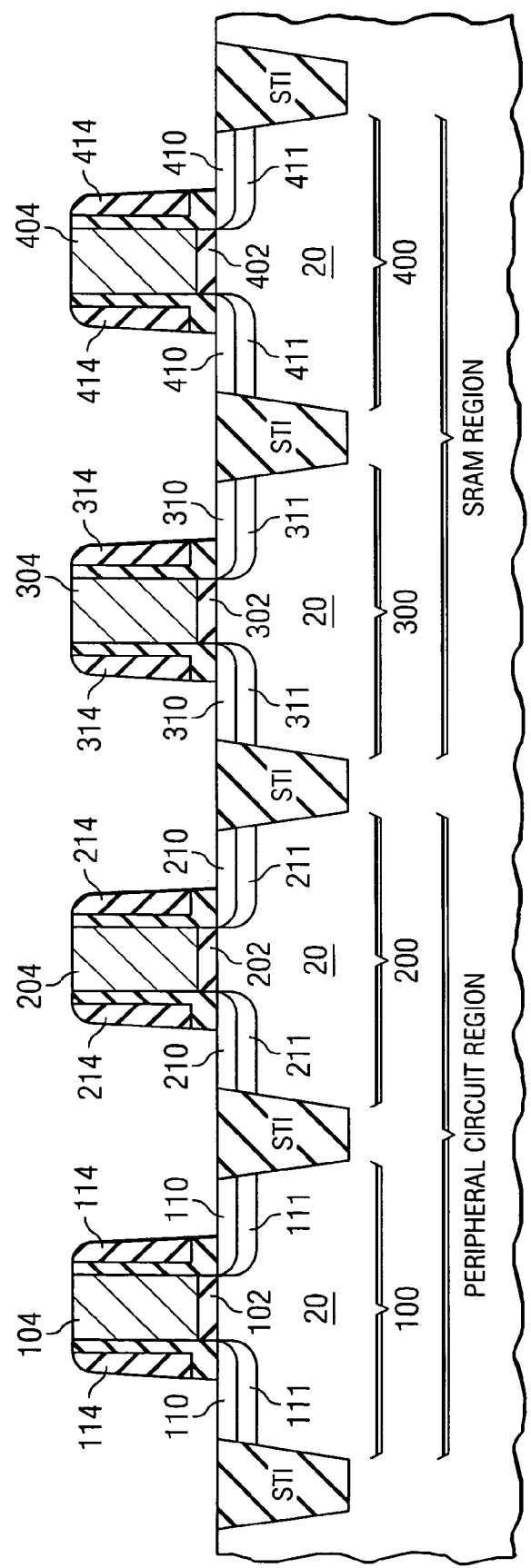

Gate spacers 114, 214, 314 and 414 are then preferably formed, as shown in FIG. 5. As is known in the art, the gate spacers are formed by forming one or more spacer layers (not shown), and etching the spacer layer. In the preferred embodiment, the spacer layer includes a nitride sub-layer on a liner oxide sub-layer. The preferred spacer deposition methods include PECVD, LPCVD, sub-atmospheric chemical vapor deposition (SACVD), and the like. The hard masks 106, 206, 306 and 406 are also preferably removed when the spacer layer is etched.

Figure 6:
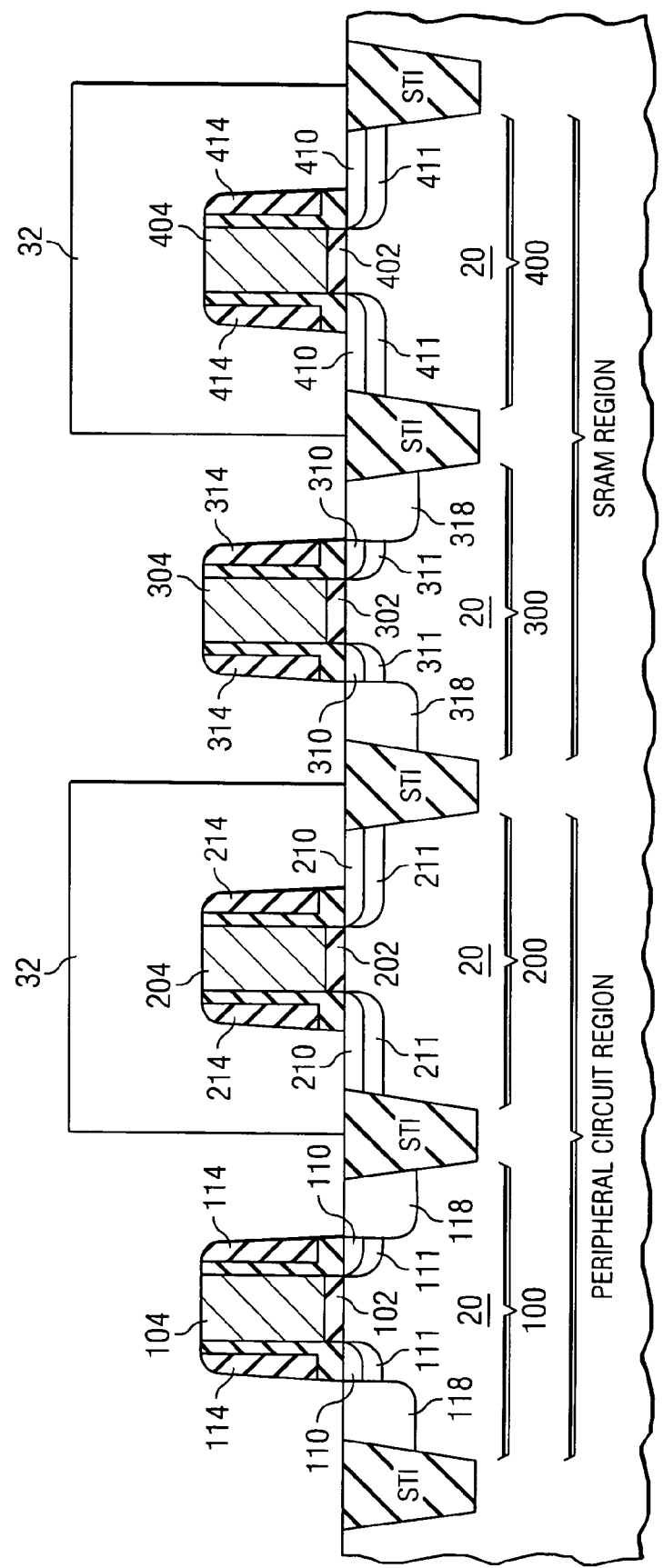

FIG. 6 illustrates the formation of SiGe stressors 118 and 318. Preferably, a photo resist 32 is formed covering regions 200 and 400. Recesses are formed in substrate 20 along the outside edges of the spacers 114 and 314, respectively, preferably by etching isotropically and/or anisotropically. Silicon stressors 118 and 318 are then formed in the recesses. In the preferred embodiment, SiGe stressors are epitaxially grown. P-type impurities such as boron are preferably doped during the epitaxial growth. The photo resist 32 is then removed. After being annealed, SiGe stressors 118 and 318 will try to restore their lattice spacing, which is greater than the lattice spacing of the substrate 20. This introduces compressive stresses in the respective channel regions of the resulting PMOS devices, and the device drive currents of the respective PMOS devices are increased.

Figure 7:
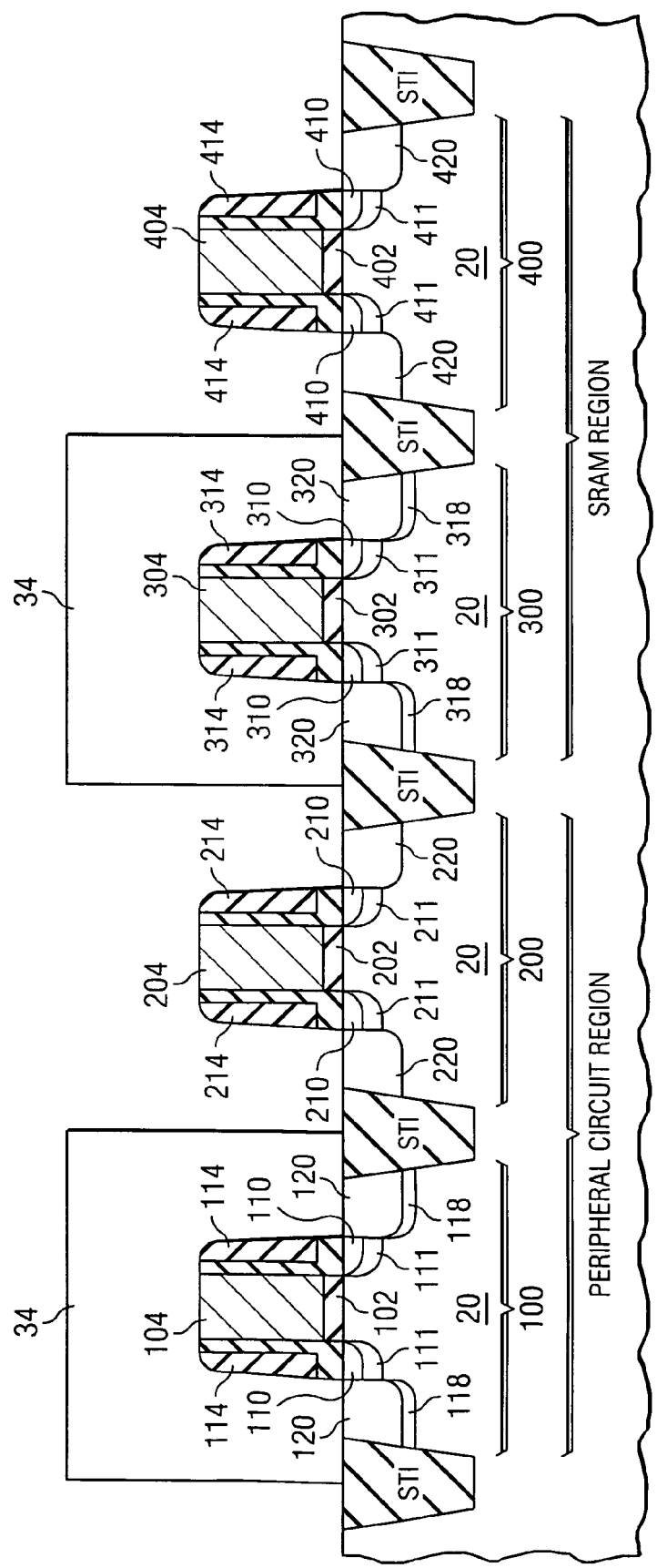

FIG. 7 illustrates the formation of deep source/drain regions 120, 220, 320 and 420. To form deep source/drain regions 220 and 420 for NMOS devices, an n-type impurity is implanted. During the implantation, PMOS regions 100 and 300 are masked by a photo resist 34. The resulting source/drain regions 220 and 420 are substantially aligned with edges of the spacers 214 and 414, respectively. Photo resist 34 is then removed.

In the preferred embodiment, SiGe stressors 118 and 318 are doped with a p-type impurity during the epitaxial growth, thus forming the source/drain regions of the respective PMOS devices. Further implantation can be performed to form deep source/drain regions 120 and 320. The resulting deep source/drain regions 120 and 320 are substantially aligned with edges of the spacers 130 and 330, respectively.

At the time the deep source/drain regions are formed, the gate electrodes in the respective regions are also doped. Since the gate electrode 304 of the pull-up PMOS device in region 300 has been pre-doped, which is the counter-doping of the conventional p-type dopants, the work function is increased to a higher level than if it is not counter-doped. As a result, the PMOS device is weakened with a reduced drive current. The preferred embodiments of the present invention thus include increasing the work function of PMOS devices to control their drive currents, and other methods to weaken the pull-up PMOS devices are also preferred. For example, the methods of reducing Vcc/Vdd in circuit design solution can also change the PMOS channel barrier to introduce different drive current, but those kinds of methods cannot change the intrinsic work function of PMOS devices. The amount of the reduction in the drive current may be affected by factors such as the n-type impurity concentration, and the optimum concentration can be found through routine experiments.

Meanwhile, the PMOS device in peripheral device region 100 is not pre-doped, and thus has a higher device current than the PMOS device in peripheral device region 300. Therefore, the SRAM cell is improved without sacrificing the performance of peripheral circuits.

In alternative embodiments, the gate electrode 304 is counter-doped at the same time the deep source/drain regions 220 and 420 are implanted. This can be achieved by forming an opening in the photo resist 34 to expose the gate electrode 304.

To finish the formation of MOS devices, silicide regions (not shown) are formed on exposed surfaces of the source/drain regions and gate electrodes of the MOS devices, followed by the formation of an etch stop layer (ESL) (not shown) and an inter-layer dielectric (ILD) (not shown). The details for forming the silicide regions, the ESL and the ILD are well known in the art, thus are not repeated herein.

Figure 8:
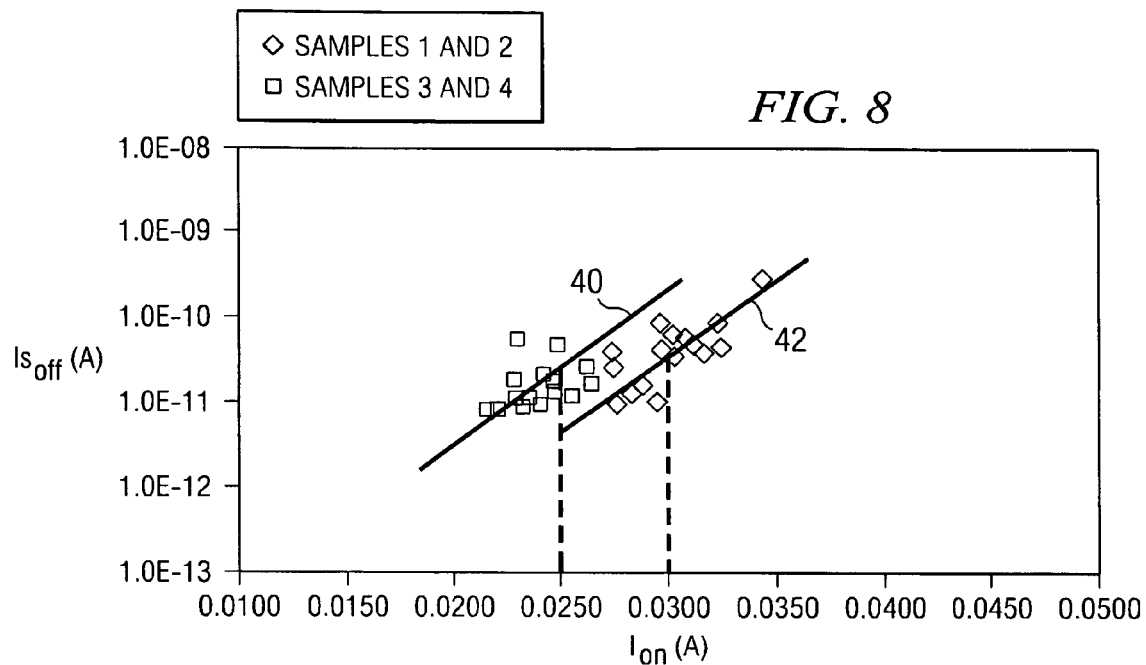
FIG. 8 illustrates source leakage currents of sample devices as a function of device drive currents.
Figure 9:
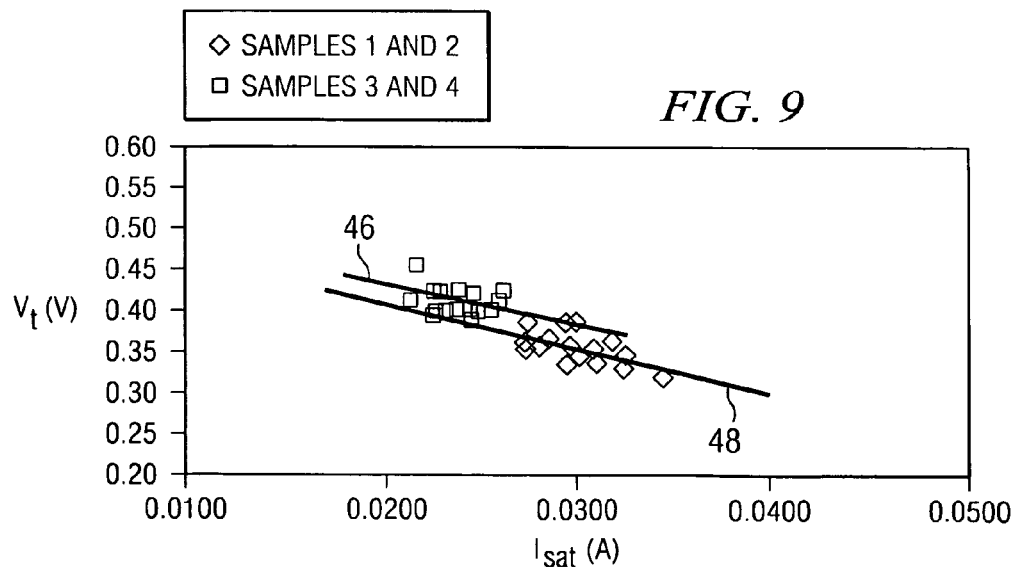
FIG. 9 illustrates threshold voltages of sample PMOS devices as a function of device saturation currents.

Experiment results of the preferred embodiments of the present invention are shown in FIGS. 8 and 9. Two sample PMOS devices 3 and 4 were formed using the preferred embodiments of the present invention. As a comparison, sample PMOS devices 1 and 2 with SiGe stressors were formed. However, PMOS devices 1 and 2 were not counter-doped. FIG. 8 illustrates the source leakage currents $I_{soff}$ of sample devices as a function of device drive currents $I_{on}$. Line 40 shows $I_{on}$-$I_{off}$ characteristics of sample PMOS devices 3 and 4, while line 42 shows $I_{on}$-$I_{off}$ characteristics of sample PMOS devices 1 and 2. It has been noted that device drive currents of the sample PMOS devices 3 and 4 were reduced by about 19 percent, compared to the sample PMOS devices 1 and 2.

FIG. 9 illustrates the threshold voltages of sample PMOS devices as a function of device saturation currents $I_{sat}$. Line 46 shows the data of sample PMOS devices 3 and 4, while line 48 shows the data of sample PMOS devices 1 and 2. It has been noted that for a given device saturation current $I_{sat}$, the threshold voltages $V_t$ of the sample PMOS devices 3 and 4 are higher than the threshold voltages $V_t$ of the sample PMOS devices 1 and 2. With higher threshold voltages, it is less likely that the pull-up devices will be turned on or off incorrectly.

A summary of parameters of samples 1, 2, 3 and 4 are shown in Table 1.

TABLE 1

|  | Samples | | | |
| --- | --- | --- | --- | --- |
|  | 1 | 2 | 3 | 4 |
| SRAM Leak | 49.2 | 62.5 | 2.8 | 36.4 |
| $V_{tlin}$(V) | 0.38 | 0.36 | 0.42 | 0.42 |
| $V_{tsat}$(V) | 0.29 | 0.28 | 0.32 | 0.33 |
| $I_{dsat}$(μA/tr) | 27 | 28 | 23 | 21 |
| $I_{doff}$(μA/tr) | 215 | 203 | 136 | 117 |
| $I_{goff}$(μA/tr) | 372 | 335 | 207 | 195 |
| $I_{soff}$(μA/tr) | 23 | 26 | 12 | 8 |
| $I_{bulk}$(μA/tr) | 2648 | 2861 | 1456 | 1734 |

Table 1 reveals that samples 3 and 4 have significantly better performance than samples 1 and 2. For example, $V_{tlin}$ and $V_{tsat}$ of sample PMOS devices 3 and 4 are about 40 mV to 60 mV higher than that of the sample PMOS devices 1 and 2. The device drive currents $I_{dsat}$ of sample PMOS devices 3 and 4 are about 19 percent lower than that of the PMOS devices 1 and 2. The drain leakage current $I_{doff}$, gate leakage current $I_{goff}$, source leakage current $I_{soff}$ and junction leakage current $I_{bulk}$ are also reduced. As a result, the overall leakage of the respective SRAM cell is reduced.

The preferred embodiments of the present invention have several advantageous features. By reducing drive currents of pull-up PMOS devices in SRAM cells, write margins of the SRAM cells are improved, resulting in more reliable and faster write operations. Meanwhile, the drive currents of PMOS devices in peripheral circuits are not affected. The improvement in the performance of the SRAM cells is achieved with no additional cost of process steps and masks.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate having a top surface; and
   a PMOS device comprising:
      a gate dielectric over the semiconductor substrate;
      a gate electrode on the gate dielectric, wherein the gate electrode comprises a p-type impurity and an n-type impurity, wherein at a plane in the gate electrode parallel to the top surface of the semiconductor substrate, the p-type impurity and the n-type impurity each have substantially uniform respective concentrations throughout the plane, and wherein the n-type impurity has a concentration of greater than about $10^{19}$/cm$^3$; and
   an additional PMOS device in a peripheral circuit, wherein a gate electrode in the additional PMOS device comprises a p-type impurity having a uniform concentration throughout a plane parallel to a top surface of the gate electrode of the additional PMOS device and an n-type impurity having a concentration of less than about $10^{19}$/cm$^3$.

2. The semiconductor structure of claim 1, wherein the PMOS device is in an SRAM cell.

3. The semiconductor structure of claim 1, wherein the PMOS device is in an inverter.

4. The semiconductor structure of claim 1, wherein the PMOS device further comprises a pocket region in the semiconductor substrate adjacent the gate dielectric, wherein the pocket region has an n-type impurity concentration of less than about $1 \times 10^{19}$/cm$^3$.

\* \* \* \* \*